United States Patent
Kim

(10) Patent No.: US 7,276,713 B2
(45) Date of Patent: Oct. 2, 2007

(54) METHOD FOR FABRICATING A METAL-INSULATOR-METAL CAPACITOR

(75) Inventor: Sang Bum Kim, Yongsan-gu (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/320,399

(22) Filed: Dec. 29, 2005

(65) Prior Publication Data

US 2006/0138357 A1    Jun. 29, 2006

(30) Foreign Application Priority Data

Dec. 29, 2004    (KR) .................... 10-2004-0115768

(51) Int. Cl.
*H01J 37/08* (2006.01)
(52) U.S. Cl. ............................ 250/492.21; 250/491.1; 250/492.3; 437/222; 178/19.01; 355/53

(58) Field of Classification Search .................... None
See application file for complete search history.

(56) References Cited

U.S. PATENT DOCUMENTS

| 6,828,572 | B2* | 12/2004 | Reece et al. | 250/492.21 |
| 6,984,832 | B2* | 1/2006 | Halling et al. | 250/492.21 |
| 2006/0138355 | A1* | 6/2006 | Yue et al. | 250/492.21 |

* cited by examiner

*Primary Examiner*—Jack I. Berman
*Assistant Examiner*—Zia R. Hashmi
(74) *Attorney, Agent, or Firm*—Lowe Hauptman & Berner LLP

(57) ABSTRACT

A method for correcting angle zero position of an ion implantation equipment. The method includes loading a semiconductor wafer into the ion implantation equipment, implanting ions into the wafer with varying angle, measuring thermal wave and sheet resistance value of the wafer, and correcting the angle zero position with reference to points at which the measured thermal wave or sheet resistance value is minimized.

7 Claims, 2 Drawing Sheets

METHOD FOR FABRICATING A METAL-INSULATOR-METAL CAPACITOR

CROSS-REFERENCE TO RELATED APPLICATION

This application claims priority to and the benefit of Korean Patent Application No. 10-2004-0115768 filed in the Korean Intellectual Property Office on Dec. 29, 2004, the entire contents of which are incorporated herein by reference.

BACKGROUND OF THE INVENTION

1. Field of the Invention

The present invention relates to semiconductor technologies, and more particularly to a method for correcting angle zero position in ion implantation equipment.

2. Description of the Related Art

Ion implantation is a viable replacement of thermal diffusion in diffusing or implanting atoms or molecules of selected dopants into a semiconductor wafer. During ion implantation, dopant atoms are accelerated by electrical energy and directed to the wafer.

The advantages of ion implantation process include accurate control of the amount of dopants, control of ion distributions, relatively decreased diffusion of dopant atoms in lateral directions than the thermal diffusion process, and uniform density of the implanted ions in the wafer. The ion implantation process is widely used for, e.g., controlling threshold voltage in metal oxide semiconductor (MOS) transistors, forming a well, isolation ion implantation, and forming a base region in bipolar transistors.

Equipment for the ion implantation typically includes a source module, an ion analyzer that extracts the produced ions by the source module, a beam gate for an ion path of the extracted ions, a target for directing the ions to the wafer surface, an end station module and auxiliary components.

Generally, the ion implantation equipment has an automatic angle control system for preventing an angle zero position from tilting. The angle control system monitors, by using five angle cups, ion beams traveling to the end station placed on the wafer, and corrects tilted angle and zero angle position. However, it is frequently observed that the zero angle is tilted even after it is corrected by the automatic angle control system. When the zero angle position is tilted, uniform ion implantation onto the wafer surface is not possible, thereby negatively affecting the electrical characteristics of semiconductor IC devices.

SUMMARY OF THE INVENTION

It is an object of the present invention to provide a method for correcting tilted angle zero position in ion implantation equipment.

Another object of the present invention is to ensure accurate angle zero position in ion implantation equipment and to improve uniform implantation of ions into the wafer.

In a first aspect, embodiments of the present invention are directed to a method for correcting angle zero position of an ion implantation equipment, comprising the steps of: loading a semiconductor wafer into the ion implantation equipment; implanting ions into the wafer with varying angle; measuring thermal wave and sheet resistance values of the wafer; and correcting the angle zero position with reference to points at which the measured thermal wave or sheet resistance value is minimum.

The angles varied at the step of implanting ion include the status of $-2°$, $-1°$, $0°$, $1°$, and $2°$.

These and other aspects of embodiments of the invention will become evident by reference to the following description of embodiments, often referring to the accompanying drawings.

DETAILED DESCRIPTION OF EMBODIMENTS OF THE INVENTION

Hereinafter, preferred embodiments of the present invention will be described with reference to the accompanying drawings.

Semiconductor wafers such as silicon wafers are loaded into an ion implantation equipment.

Ion implantation is carried out with an angle set by an ion implantation screen, and the wafer is unloaded. The ion implantation is performed with each of angles $-2°$, $-1°$, $0°$, $1°$, $2°$ and under conditions of, e.g., 40 keV to 70 keV energy with $1*10^{13}$ to $1*10^{14}$ of boron ions.

Then, thermal wave values are measured with the ion implanted wafer.

Then, sheet resistance values are measured after rapid heating of the wafer at, e.g., 1,100° C.

Figure 1:
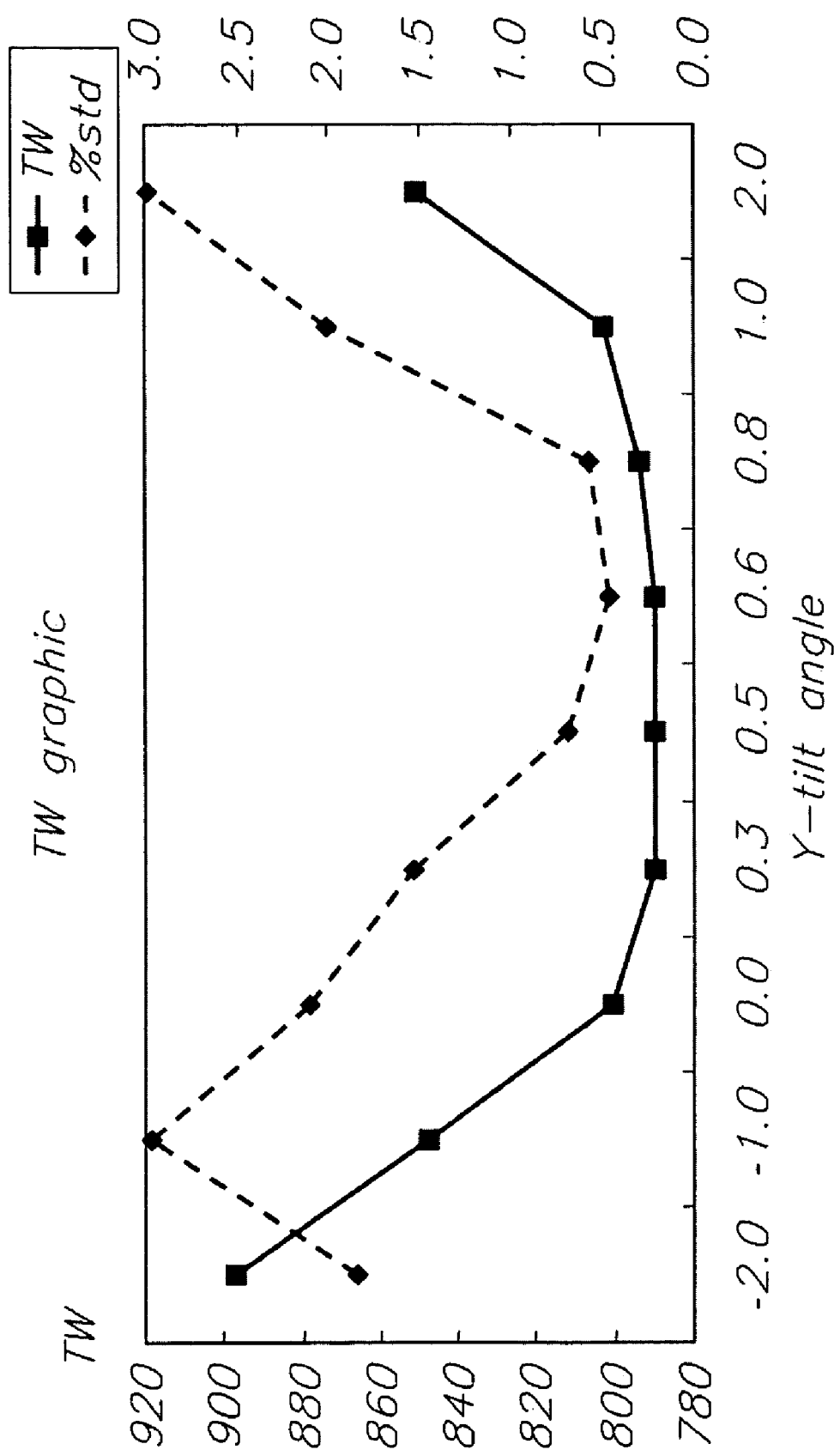
FIG. 1 is a graph showing thermal wave values measured according to the present invention.

The measured thermal wave and sheet resistance values are represented by graphs. FIG. 1 is a graph showing thermal wave values measured according to the present invention, and FIG. 2 is a graph showing sheet resistance values measured according to the present invention.

The minimum points of the measured thermal wave and sheet resistance values represent angle zero positions of the ion implantation equipment. Therefore, when the minimum values of the measured thermal wave and sheet resistance are at the points of angle of zero, the ion implantation equipment is correctly set. However, when the minimum values of the measured thermal wave and sheet resistance are observed at the other angle points, it is determined that the angle zero position is tilted. In these cases, the amount of tilted angle is measured with the precision of less than +−0.5 degrees. Then, the amount of tilted angle is compensated by a home position value to correct the angle zero position.

Figure 2:
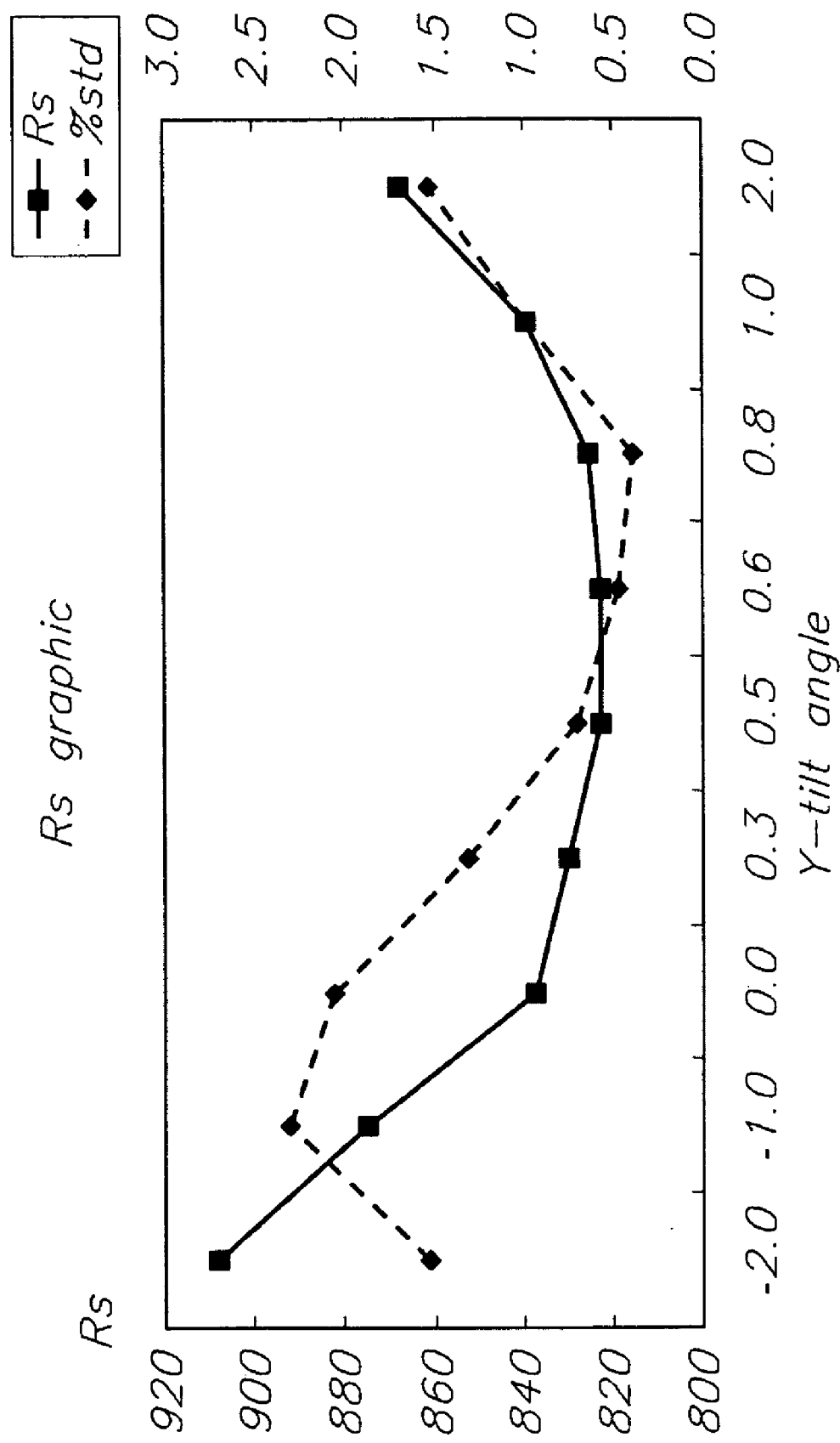
FIG. 2 is a graph showing sheet resistance values measured according to the present invention.

Referring to FIGS. 1 and 2, the minimum values are observed at some position between angles "0" and "1" in angle zero position monitoring step. Accordingly, at each point of angles "0.25", "0.5", and "0.75", the measurement is carried out, and thermal wave and sheet resistance values are measured to have minimum value at some position between angles "0.5" and "0.75". When the values are measured at angle of "0.6", it is found that the angle zero position is at angle "0.6".

Therefore, the angle zero position of ion implantation equipment is compensated by 0.6 degrees.

With the present invention, the tilted angle is confirmed and compensated during the ion implantation process, and hence it is possible to ensure the uniform implantation of ions and to prevent variation of electrical characteristics of semiconductor IC devices.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for correcting an angle zero position of an ion implantation equipment, said method comprising the steps of:
    loading a semiconductor wafer into the ion implantation equipment;
    implanting ions into the wafer with varying angle;
    measuring thermal wave values of the wafer; and
    correcting the angle zero position with reference to points at which the measured thermal wafer value is at a minimum.

2. The method of claim 1, wherein the angle varied at the step of implanting ions includes angles of −2°, −1°, 0°, 1°, and 2°.

3. The method of claim 1, wherein the ion implantation is performed with a dose of boron ions of $1*10^{13}$ to $1*10^{14}$ and at an energy of 40 keV to 70 keV.

4. A method for correcting an angle zero position of an ion implantation equipment, said method comprising the steps of:
    loading a semiconductor wafer into the ion implantation equipment;
    implanting ions into the wafer with varying angle;
    measuring thermal wave values and sheet resistance values of the wafer; and
    correcting the angle zero position with reference to points at which both the measured thermal wave value and sheet resistance value are minimum.

5. The method of claim 4, wherein the angle varied at the step of implanting ions includes angles of −2°, −1°, 0°, 1°, and 2°.

6. The method of claim 4, wherein the ion implantation is performed with a dose of boron ions of $1*10^{-}$ to $1*10^{-}$ and at an energy of 40 keV to 70 keV.

7. The method of claim 4, wherein measuring thermal wave values and sheet resistance values of the wafer further comprises measuring thermal wave values followed by measuring sheet resistance values after rapidly heating the semiconductor wafer.

* * * * *